United States Patent
Evans

(10) Patent No.: US 9,641,182 B2
(45) Date of Patent: May 2, 2017

(54) SYSTEM AND METHOD FOR DYNAMIC FREQUENCY ESTIMATION FOR A SPREAD-SPECTRUM DIGITAL PHASE-LOCKED LOOP

(71) Applicant: Nvidia Corporation, Santa Clara, CA (US)

(72) Inventor: Kenneth Evans, Santa Clara, CA (US)

(73) Assignee: Nvidia Corporation, Santa Clara, CA (US)

(*) Notice: Subject to any disclaimer, the term of this patent is extended or adjusted under 35 U.S.C. 154(b) by 360 days.

(21) Appl. No.: 14/169,598

(22) Filed: Jan. 31, 2014

(65) Prior Publication Data

US 2015/0222284 A1    Aug. 6, 2015

(51) Int. Cl.
*H03B 21/00* (2006.01)
*H03L 7/081* (2006.01)
*H03L 7/099* (2006.01)
*H03L 7/107* (2006.01)
*H03L 7/18* (2006.01)

(52) U.S. Cl.
CPC ............ *H03L 7/081* (2013.01); *H03L 7/0994* (2013.01); *H03L 7/1075* (2013.01); *H03L 7/18* (2013.01); *H03L 2207/50* (2013.01)

(58) Field of Classification Search
CPC ..................................................... H03L 7/1806
USPC .......................................................... 327/107
See application file for complete search history.

(56) References Cited

U.S. PATENT DOCUMENTS

| | | | |
|---|---|---|---|
| 8,559,587 B1* | 10/2013 | Buell | H03K 23/662 377/47 |
| 2010/0182049 A1* | 7/2010 | Sjoland | H03L 7/091 327/7 |
| 2011/0286510 A1* | 11/2011 | Levantino | H03B 27/00 375/226 |
| 2015/0215110 A1* | 7/2015 | Chen | H03K 3/037 375/362 |

* cited by examiner

*Primary Examiner* — Lincoln Donovan
*Assistant Examiner* — Metasebia Retebo

(57) ABSTRACT

A digital phase-and-frequency controller. In one embodiment, the controller includes: (1) a first segment accumulator operable to accumulate errors while an accumulation-selection signal has a first value and (2) a second segment accumulator operable to accumulate errors while said accumulation-selection signal has a second value, and (3) circuitry operable to produce the control signal using the errors accumulated in the first segment accumulator while a use-selection signal has a first value and the errors accumulated in the second segment accumulator while the use-selection signal has a second value.

20 Claims, 8 Drawing Sheets

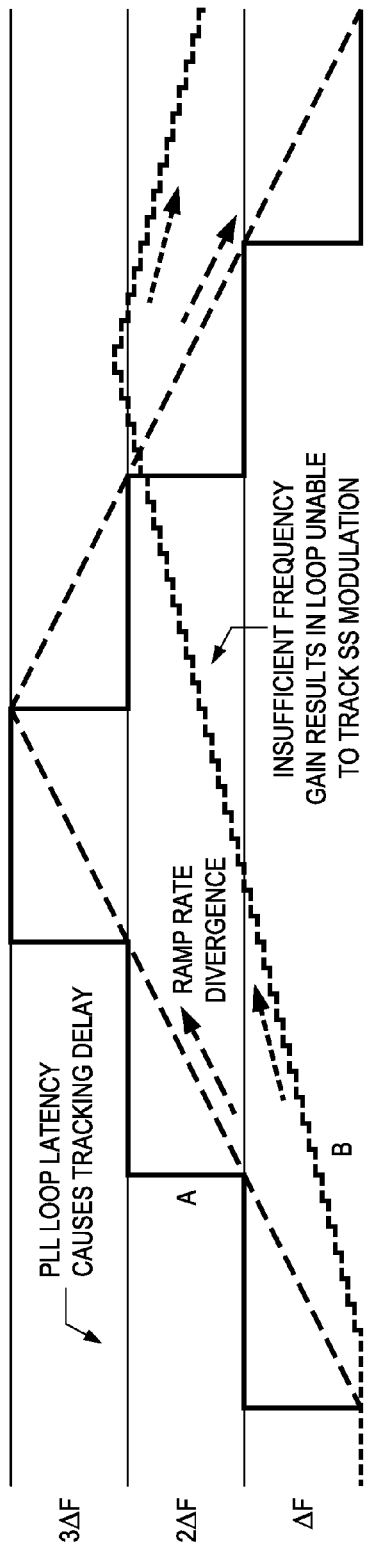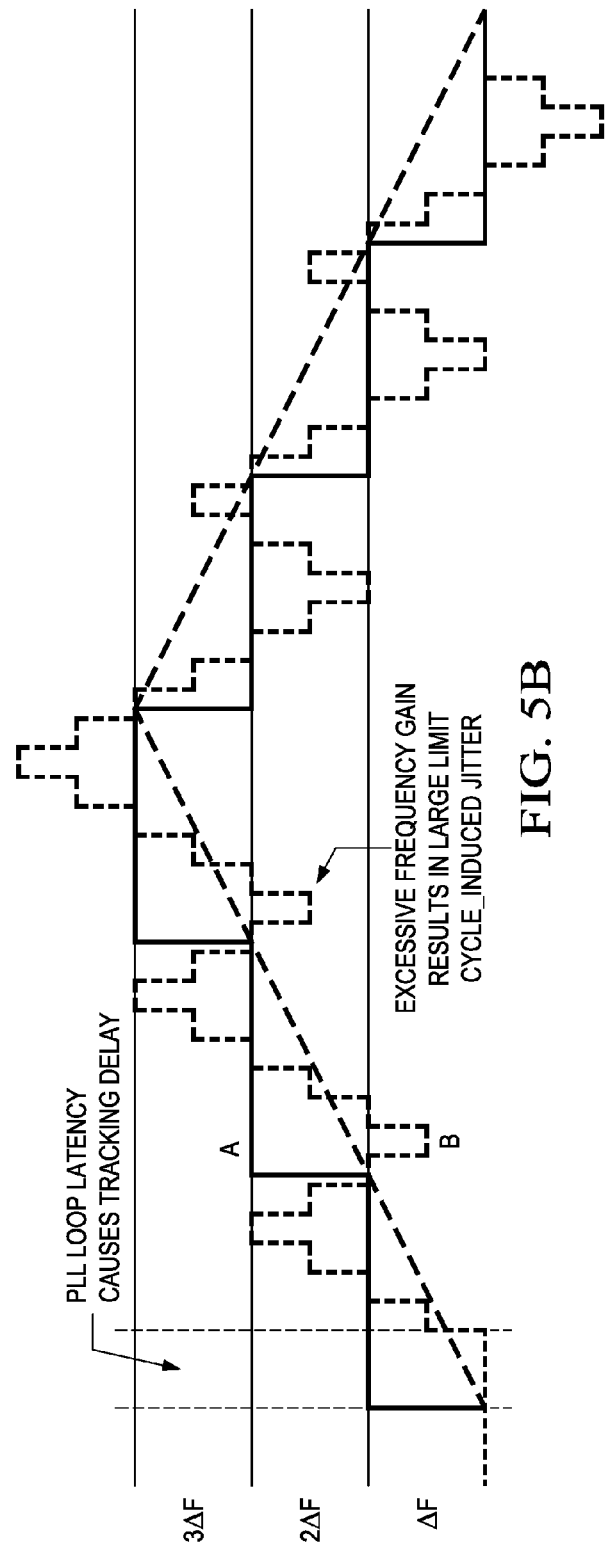

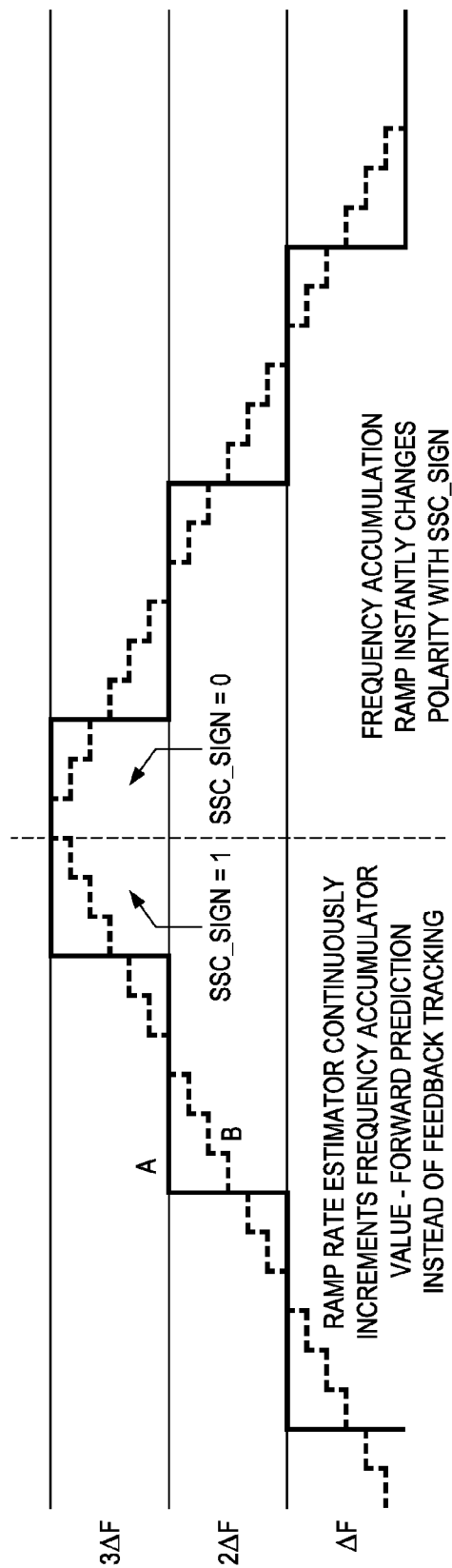

of a nonlinear digital PLL.

SYSTEM AND METHOD FOR DYNAMIC FREQUENCY ESTIMATION FOR A SPREAD-SPECTRUM DIGITAL PHASE-LOCKED LOOP

TECHNICAL FIELD

This application is directed, in general, to spread-spectrum clock generation and, more specifically, to dynamic frequency estimation for spread-spectrum digital phase-locked loops (PLLs).

BACKGROUND

As those skilled in the pertinent art understand, packaged integrated circuits (ICs) tend to produce electromagnetic interference (EMI), which can impair radio-frequency (RF) communication or the operation of neighboring circuits/systems. One way to reduce EMI is to operate EMI-producing circuits not at a fixed clock frequency, but at a frequency that varies over time. This spreads the energy of EMI over a band of frequencies and reduces the interference observed over any given single frequency.

A circuit configured to produce a clock with frequency that varies over time is referred to as a spread-spectrum (SS) clock generator (SSCG). In a typical embodiment, a SSCG will ramp the frequency of the clock signal in a periodic, saw-tooth pattern, with the range and periodicity governed by the application's specification. A typical modulation range is on the order of a few thousand parts per million (ppm), with 5000 ppm being a common value. A typical modulation rate is on the order of tens of kilohertz (kHz), with 33 kHz being a common value. The modulation is typically "down-spread", which means the clock frequency is only modulated downward from a nominal frequency, and modulated back up to the nominal frequency from a minimum frequency value.

A fundamental circuit implementation of a SSCG is a phase-locked loop (PLL). Although analog PLLs have historically been used in SSCGs, analog PLL designs require significant labor to migrate from one IC process technology to another. In contrast, digital PLLs have been demonstrated to be far more portable.

A PLL commonly contains a phase-and-frequency detector, which will produce an error signal based on the difference between reference clock and output clock phases. The error signal is then fed into a digital phase and frequency controller. PLLs can be linear or nonlinear. In a linear PLL, the error signal magnitude is proportional to the difference between the two phases, while in a nonlinear PLL, the error signal only indicates the direction of error. While analog PLLs are exclusively linear, digital PLLs can be designed to be linear or nonlinear. However, because linear digital PLLs have been demonstrated to be costly in complexity and power consumption, nonlinear varieties are heavily preferred. A bang-bang digital PLL (BBDPLL) is a common implementation of a nonlinear digital PLL.

SUMMARY

One aspect provides a digital phase-and-frequency controller. In one embodiment, the controller includes: (1) a first segment accumulator operable to accumulate errors while an accumulation-selection signal has a first value and (2) a second segment accumulator operable to accumulate errors while the accumulation-selection signal has a second value and (3) circuitry operable to produce the control signal using the errors accumulated in the first segment accumulator while a use-selection signal has a first value and the errors accumulated in the second segment accumulator while the use-selection signal has a second value.

Another aspect provides a method of producing a digital control signal. In one embodiment, the method includes: (1) accumulating errors in a first segment accumulator while an accumulation-selection signal has a first value and (2) accumulating errors in a second segment accumulator while the accumulation-selection signal has a second value and (3) using the value accumulated in the first segment accumulator while a use-selection signal has a first value to generate the control signal and (4) producing the control signal using the errors accumulated in the first segment accumulator while a use-selection signal has a first value and the errors accumulated in the second segment accumulator while the use-selection signal has a second value.

Yet another aspect provides a digital spread-spectrum clock generator. In one embodiment, the clock generator includes: (1) an oscillator and (2) a feedback loop and (3) a phase and frequency controller, including: (3a) a first segment accumulator operable to accumulate errors while an accumulation-selection signal has a first value, (3b) a second segment accumulator operable to accumulate errors while the accumulation-selection signal has a second value and (3c) circuitry operable to produce the control signal using the value accumulated in the first segment accumulator while a use-selection signal has a first value and using the value accumulated in the second segment accumulator while the use-selection signal has a second value.

BRIEF DESCRIPTION

Reference is now made to the following descriptions taken in conjunction with the accompanying drawings, in which:

FIG. 5A illustrates exemplary waveforms in a BBDPLL without spread-spectrum frequency estimation when frequency control gain is insufficient;

FIG. 5B illustrates exemplary waveforms when frequency control gain is excessive;

FIG. 5C illustrates exemplary waveforms in a BBDPLL with spread-spectrum frequency estimation;

DETAILED DESCRIPTION

It is realized herein that, while BBDPLLs have the potential to make a high-quality SSCG, the conventional digital phase and frequency controller (PFC) is problematic. More specifically, it is realized herein that the conventional PFC's phase control branch amplifies phase errors produced by the digital phase/frequency detector, and that the conventional PFC's frequency control branch is a digital accumulator that performs "static frequency"-only estimation. The error signal within a BBDPLL typically only takes on values of +1 and −1, and the accumulator will correspondingly adjust the output frequency upward or downward upon receiving a new value of the error signal. Once the BBDPLL converges to a static frequency, the accumulation of future error symbols produces zero additional value. This means that, when the BBDPLL acts as a static frequency synthesizer, the accumulator will estimate future values of frequency control to be the same as previous values once convergence has been achieved. However, the accumulator remains unable to estimate dynamic changes in frequency, such as those induced by a spread-spectrum controller when the BBDPLL functions as a SSCG.

Introduced herein are various embodiments of a system and a method for dynamic estimation of frequency ramp rates for a BBDPLL for improved SS clock generation. The various embodiments employ a novel technique for introducing an additional digital control state that performs accurate estimation of dynamic frequency changes induced by operation of the BBDPLL as a SSCG.

Figure 1:
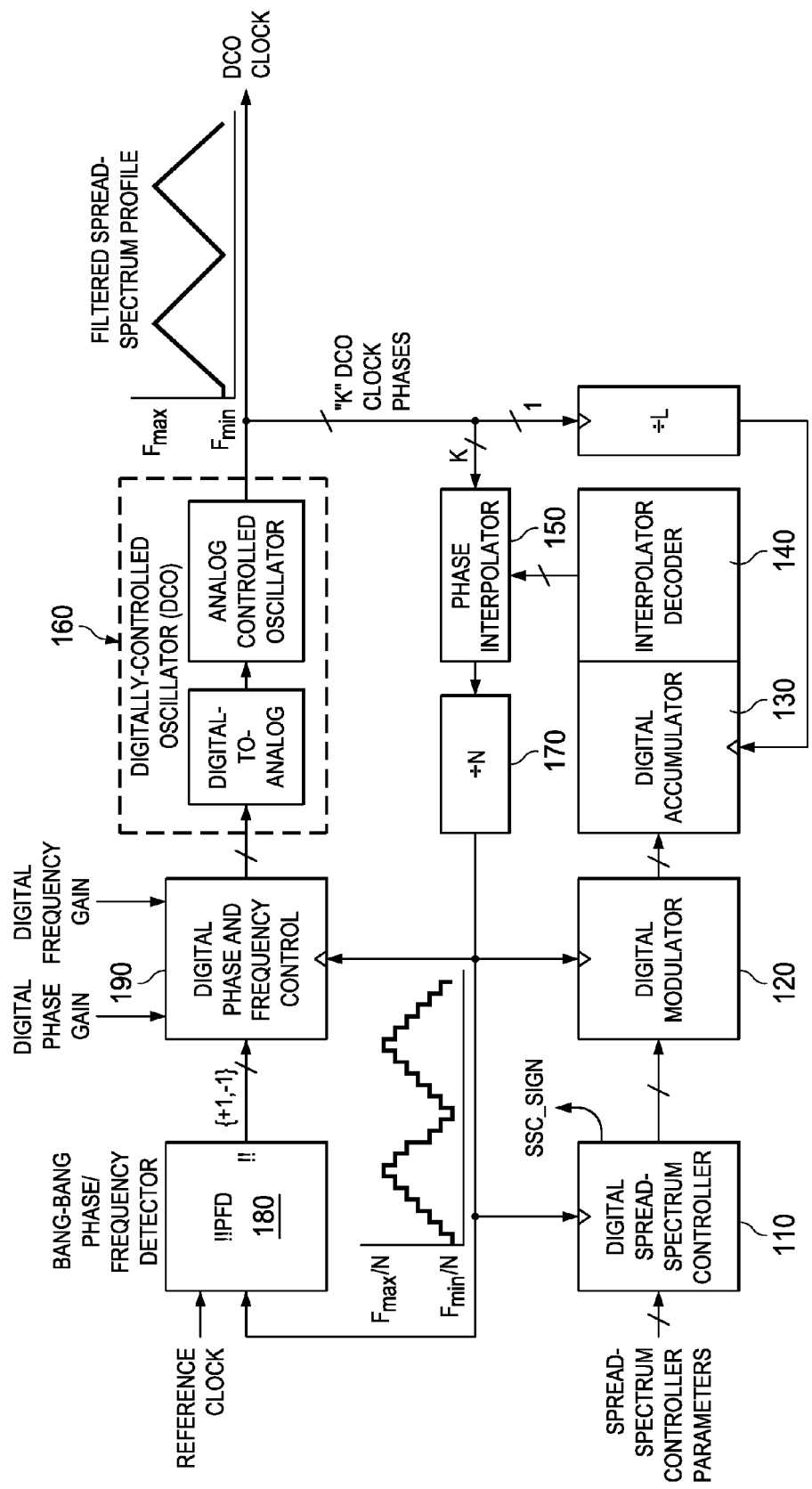
FIG. 1 illustrates a block diagram of one embodiment of a phase-interpolator BBDPLL for spread-spectrum clock generation.

As those skilled in the pertinent art are aware, an SSCG PLL requires a mechanism to dynamically adjust its oscillator frequency over a small range. Small clock frequency offsets can be realized by continuous rotation of the clock's phase; the value of the offset is rate at which the phase moves across 360 degrees. If multiple phases of the feedback clock are made available, the frequency offset can be realized by discretely but ceaselessly rotating a round-robin selection of a single phase from the plurality of phases to return to the phase/frequency detector. The magnitude of the frequency offset can be controlled by the rate at which rotated selection of clock phases is performed. One prevalent way of making multiple phases available is by insertion of a phase-interpolator circuit in the feedback path of the PLL. FIG. 1 illustrates a block diagram of one embodiment of a phase-interpolator BBDPLL for spread-spectrum clock generation. The phase-interpolator BBDPLL includes a digital spread-spectrum controller (SSC) 110, a digital modulator 120, a digital accumulator 130, an interpolator decoder 140, and a phase interpolator 150. The SSC 110 produces the saw-tooth SS modulation pattern, and will be described in greater detail below. The phase interpolator 150 is a high-resolution phase generator, and the digital accumulator 130 provides a control prefix. Together, the phase interpolator 150 and the digital accumulator 130 act as a digital frequency generator, embedding a small frequency offset in the clock of a digitally-controlled oscillator (DCO) 160. The result is divided by a divide-by-N circuit 170 and returned to a bang-bang phase/frequency detector (BBPFD) 180. The digital modulator 120 enhances the tuning resolution of the combination of the digital accumulator 130 and the interpolator detector 140. The modulated frequency at the input of the BBPFD 180 is pushed to the input of a PFC 190 as an error signal, which is processed to yield a digital phase and frequency control signal to DCO 160. Although the embodiment of FIG. 1 employs a digital PLL, an alternative embodiment employs an analog PLL.

Figure 2:
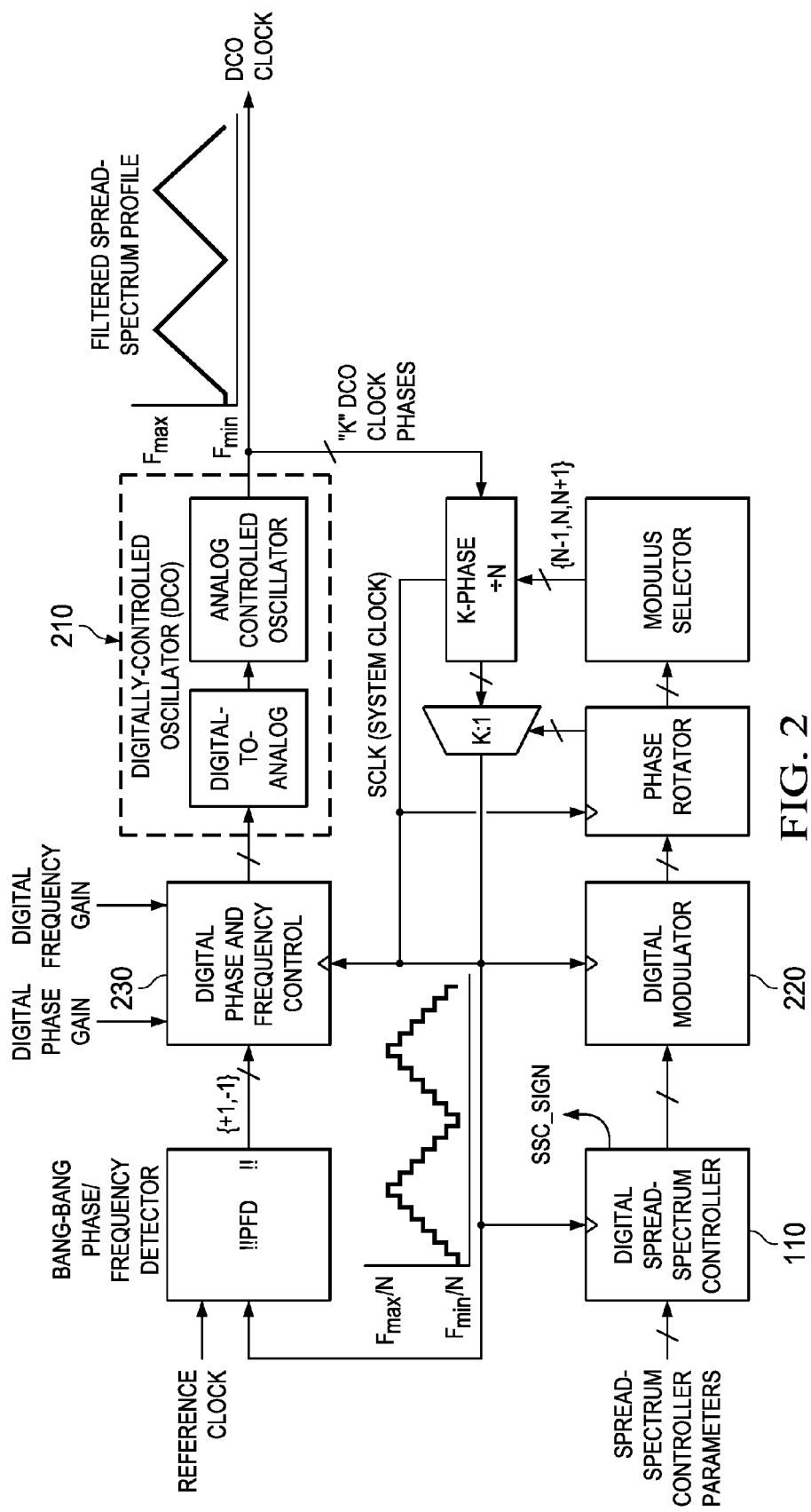
FIG. 2 illustrates a block diagram of one embodiment of a multi-phase divider BBDPLL for spread-spectrum clock generation.

Another prevalent way of making multiple clock phases available is by directly generating multiple phases of the divide-by-N output clock. FIG. 2 illustrates a block diagram of one embodiment of a multi-phase divider BBDPLL for spread-spectrum clock generation. In this embodiment, a single phase from a plurality of K phases from DCO 210 is frequency-divided by a divide-by-N circuit, and the resulting clock is sampled by all K DCO phases to produce K divided clocks that are phase-aligned with the plurality of phases of DCO 210. K is the number of available phases. A phase rotator is employed to ceaselessly rotate the selection of divided clocks in round-robin fashion through a K:1 MUX circuit. The discrete rotation of divided clock selection induces a frequency offset that exhibits poor resolution due to the limited number of available phases, K. Modulator 220 dynamically scrambles the direction and sequence of rotation to enhance the tuning resolution of the frequency offset. Although the embodiment of FIG. 2 employs a digital PLL, an alternative embodiment employs an analog PLL.

Figure 3:
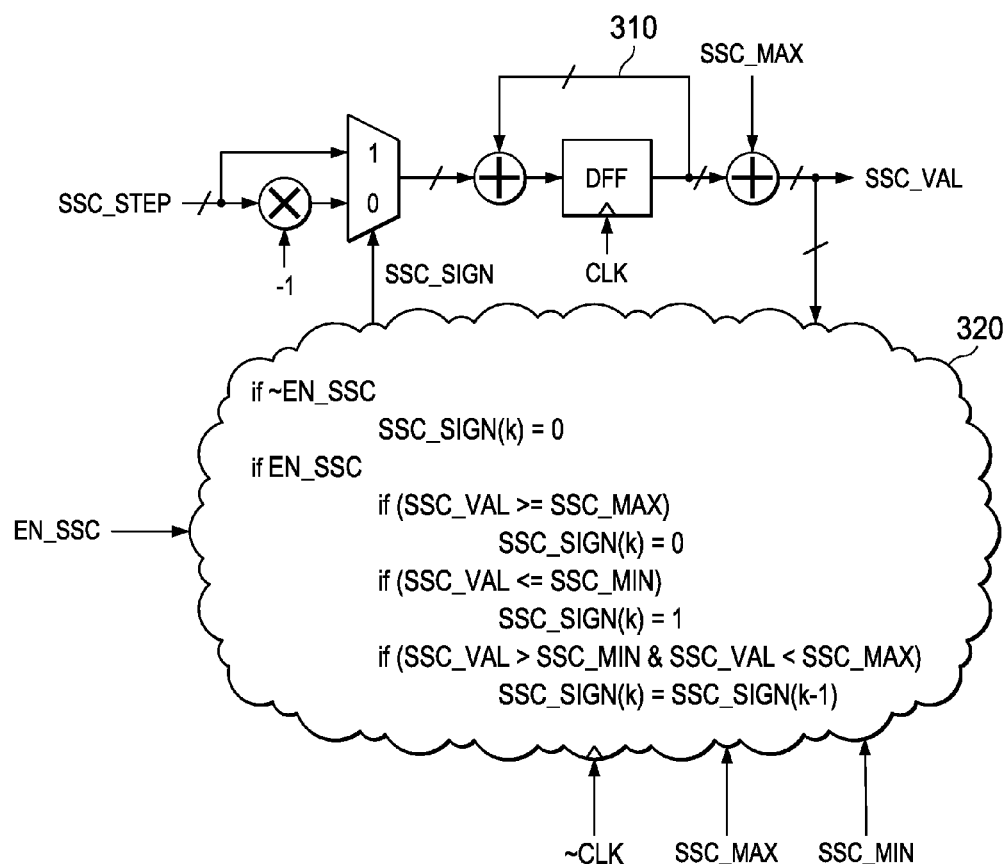
FIG. 3 illustrates an exemplary implementation of a digital downspread SS controller (SSC)

The SSC 110 produces the saw-tooth SS modulation pattern. FIG. 3 illustrates an exemplary implementation of a digital downspread SSC. The output SSC_VAL is a staircase signal approximating analog ramps in a saw-tooth pattern. Steps of size SSC_STEP are accumulated in an accumulation loop 310 and added to SSC_MAX, the maximum SS control value. Appropriate logic 320 detects if the output SSC_VAL has reached the boundaries of the spread range defined by SSC_MIN and SSC_MAX. If so, the polarity of accumulation is reversed, changing the direction of the staircase, and the signal SSC_SIGN will change logical value.

The disturbances presented by the staircase output take the form of steps. As noted above, in a linear PLL, a step disturbance produces an error signal proportional to the size of each disturbance. The magnitude of the error signal renders estimation of the target frequency straightforward. In contrast, a BBDPLL produces a digital error signal indicating only whether the frequency should be raised or lowered, but not by how much. Thus, the BBDPLL DCO control value slews over time in multiple steps of equal size towards convergence with the desired DCO frequency.

Figure 4:
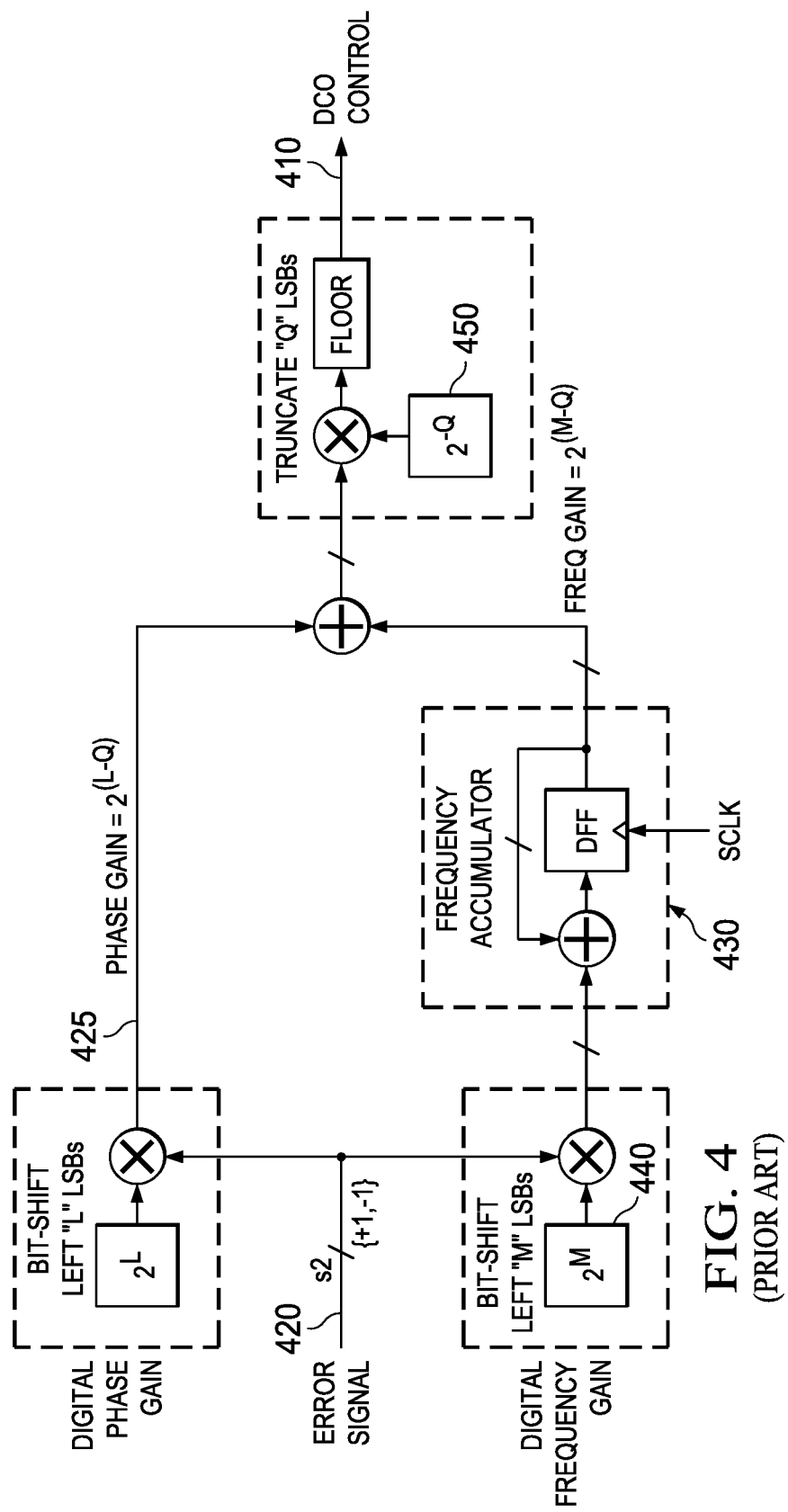
FIG. 4 illustrates a prior-art implementation of a BBDPLL PFC.

A discussion of the PFCs 190 in FIG. 1 and 230 in FIG. 2 follows. FIG. 4 illustrates a prior-art implementation of a BBDPLL PFC. An output signal 410 is based on an error signal 420. The output signal 410 is the sum of a direct gain path 425 and accumulation path through the frequency accumulator 430. If the error signal 420 is a steady stream of +1s or −1s, the BBDPLL is undergoing frequency acquisition. The path through digital phase gain amplifies the error signal by a value of $2(L-Q)$ to provide instantaneous frequency correction to the DCO, but cannot retain memory of updates to control value 410. Conversely, the accumulator 430 retains memory of past error signal values and has a gain value of $2(M-Q)$. As the DCO control value is built up over time, the PLL converges to the correct frequency value and the error signal 420 will exhibit an equal distribution of +1s and −1s over time. At this point, the frequency accumulator 430 maintains its state and thus always forecasts future control values to be the same as previous control values. Consequently, the PFC is able to maintain frequency control bias through the accumulator 430, but can only react to external phase/frequency disturbances as a tracking filter.

The forward phase gain $2(L-Q)$ is normally limited to a maximum value of +1, but more typically takes on values in the range of $0<2(L-Q)<+1$. The forward frequency gain $2(M-Q)$ is the combination of a gain 440 and a gain 450. The values of L and M are chosen such that the phase gain value is several hundred to several thousand times the frequency gain value so as to guarantee stable PLL dynamics. Once a fixed value of Q is determined, the forward frequency gain can be changed by adjusting M. When the BBDPLL functions as an SSCG, controller performance is poor if this gain is insufficient or excessive. FIG. 5A illustrates exemplary waveforms in a BBDPLL when this gain is insufficient. Waveform A represents the feedback path dynamic frequency offset induced by the SS controller, while waveform B is the frequency of the DCO output clock. Due to insufficient digital frequency gain, the slew rate of the BBDPLL's frequency control is inadequate and loop tracking does not keep up with the SS modulation profile. In addition, PLL loop latency 510 results in tracking delay. FIG. 5B illustrates exemplary waveforms when the forward frequency gain is excessive. In this case, embedded limit cycles, present in all finite-resolution feedback loops, are amplified greatly and worsen the BBDPLL's overall jitter performance.

It is realized herein that in order to optimize the value of the digital frequency gain 440 of FIG. 4, the code-to-frequency conversion gain of the DCO must be known a priori. Because this conversion gain is an electrical parameter that is a strong function of process, supply voltage, and temperature (PVT), maintaining an optimum digital frequency gain value over all possible operating conditions is problematic.

Figure 6:
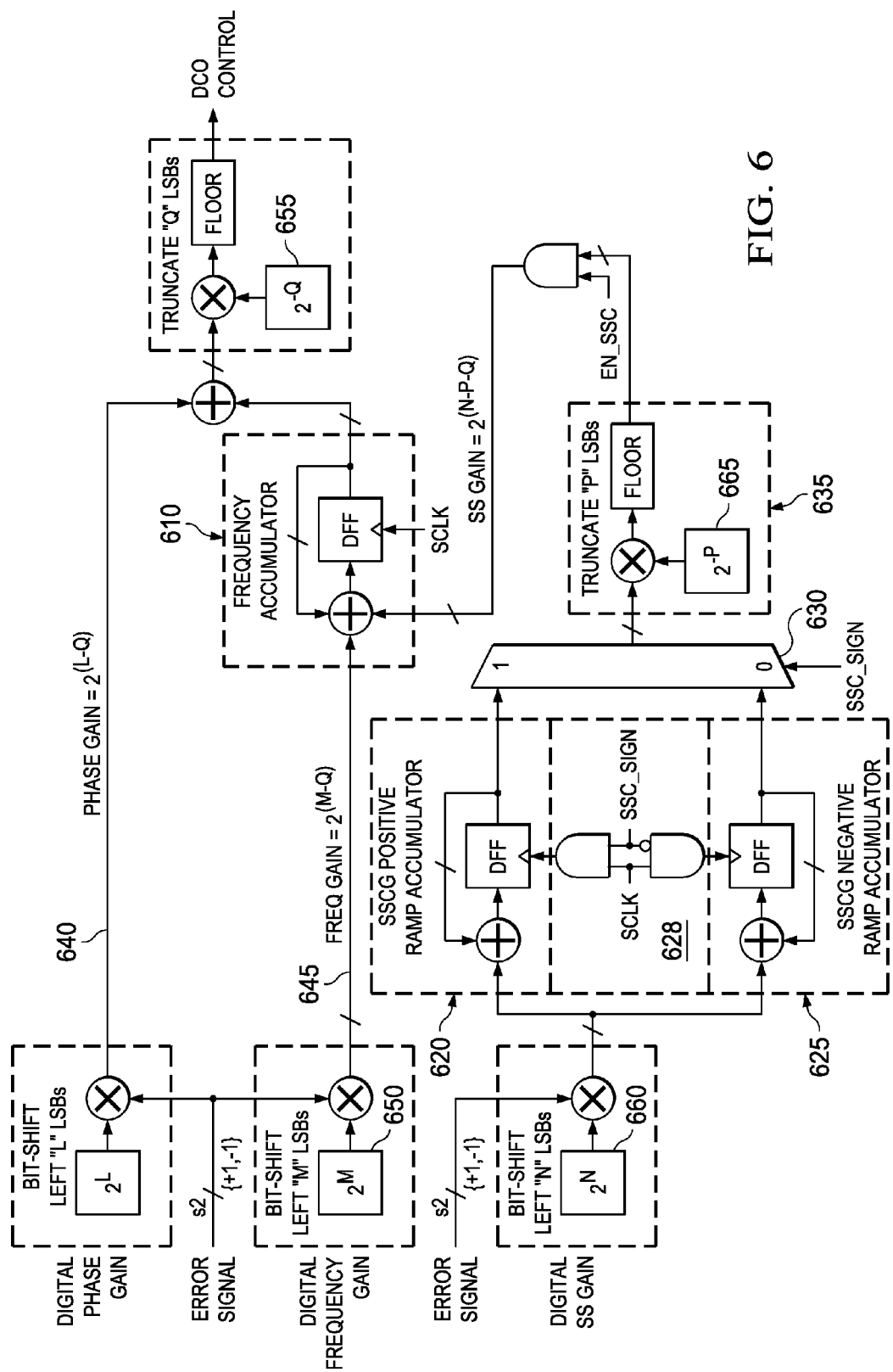
FIG. 6 illustrates an embodiment of a BBDPLL phase and frequency controller with spread-spectrum rate estimation.

FIG. 6 illustrates an embodiment of a BBDPLL PFC with spread-spectrum rate estimation. A frequency accumulator 610, an SSCG positive-ramp accumulator 620, and an SSCG negative-ramp accumulator 625 are employed. Below, the positive-ramp accumulator 620 and the negative-ramp accumulator 625 are collectively referred to as the SSCG accumulators. The SSCG accumulators may also be referred to as first and second segment accumulators. The positive-ramp accumulator 620 accumulates errors while the SSC staircase signal is ramping up, i.e. when SSC_SIGN=1. During this phase, the output of the positive-ramp accumulator 620 is updated by the controller update clock SCLK in an update selection circuit 628 and forwarded to the frequency accumulator 610 by the use-selection circuit 630. In contrast, the negative-ramp accumulator 625 accumulates errors while the SSC staircase signal is ramping downward, i.e. when SSC_SIGN=0. During this phase, the output of the negative accumulator 625 is updated by the controller update clock SCLK, and forwarded to the frequency accumulator 610 by the selection circuit 630. As the direction of the SSC ramp changes, the selection circuit 630 changes the accumulated value input to the frequency accumulator 610 instantly. Since the outputs of the SSCG accumulators are in turn accumulated in frequency accumulator 610, the embodiment performs a double accumulation.

In another embodiment, an accumulation-selection signal may be used in the update-selection circuit 628 to select which SSCG accumulator is updated, and a different, use-selection, signal may be used in the use-selection circuit 630, allowing time periods for SSCG error accumulation and use to be somewhat different. In the embodiment of FIG. 6, the SSC_SIGN signal is used as both the accumulation-selection and the use-selection signal.

Prior to operation, the SSCG accumulators are programmed to initial values. As the SSC ramps down and up from the nominal frequency, the embodied PFC initially behaves as a tracking filter. That is, the output of the frequency accumulator 610 slews at a constant rate in the same direction as the sign of the error. As errors are accumulated in the SSCG accumulators, frequency ramp values of growing magnitude produced at output of gain unit 665 are fed to the frequency accumulator 610, increasing the slope of frequency accumulation. This process continues until the time-averaged error is driven to zero. In other words, the output of gain unit 635 converges to a single positive value (SS modulation positive ramp) and a single negative value (SS modulation negative ramp) such that, when added in the frequency accumulator 610, causes the rate of frequency accumulation to precisely match the rate of frequency change driven by the SSC. Separate positive-ramp and negative-ramp accumulators are required because positive and negative accumulations neutralize each other, preventing a single accumulator from ever converging to a final solution. FIG. 5C illustrates exemplary waveforms in a BBDPLL with spread-spectrum frequency estimation. The ramp rate of the waveform B, the frequency of the DCO output clock, has converged to that of the waveform A, the feedback path frequency offset generated by the SS controller.

By virtue of negative feedback, the SSCG accumulators relieve the frequency accumulator 610 of the need to track time-varying changes in the frequency of the PLL clock. In effect, by a process of learning over periods of SS modulation, the SSCG accumulators discover the optimal ramp rates and retain this learned rate for use over subsequent periods. This learning effectively encapsulates the estimation of the target frequency, not possible in the prior-art PFC of FIG. 4 operating with a bang-bang error signal.

Considerable latitude exists in setting the initial values of the SSCG accumulators. They can be set within a range from zero to a maximum magnitude safely below their steady-state values, determined without undue experimentation. Small values will result in a longer period of accumulation to the steady-state, but are otherwise acceptable.

In FIG. 6, the forward gain of the phase control path 640 is $2^{(L-Q)}$. The forward gain of the frequency accumulator path 645 is $2^{(M-Q)}$, the combination of a gain 650 and a gain 655. As is with the prior-art PFC of FIG. 4, the phase gain must be several hundred to several thousand times that of the frequency gain to ensure stable PLL dynamics. Finally, $2^{(N-P-Q)}$ is the forward gain of the SSCG accumulators, the combination of a gain 660, a gain 665, and the gain 655. Because the PFC of FIG. 6 does not use the phase and frequency control paths to track the SS modulation profile, values of L, M, and Q, can be chosen to promote small phase gain (to reduce limit cycles), while ensuring stable control dynamics. Once these parameters are selected, the P value of gain unit 665 as well as N value of programmable SS gain must be chosen to ensure stable loop dynamics in the presence of SS modulation. To ensure stable operation, the forward gain of the SSCG accumulators must be significantly smaller than the forward gain of the frequency accumulator 610, which itself must be significantly smaller than the forward gain of the phase control path. P and Q can each range from approximately 5 to approximately 11, with 8 being a typical value. In contrast to the prior-art PFC of FIG. 4, fine-tuning of these values is not required in the embodiment of FIG. 6, and acceptable values are not sensitive to PVT variations.

Figure 7:
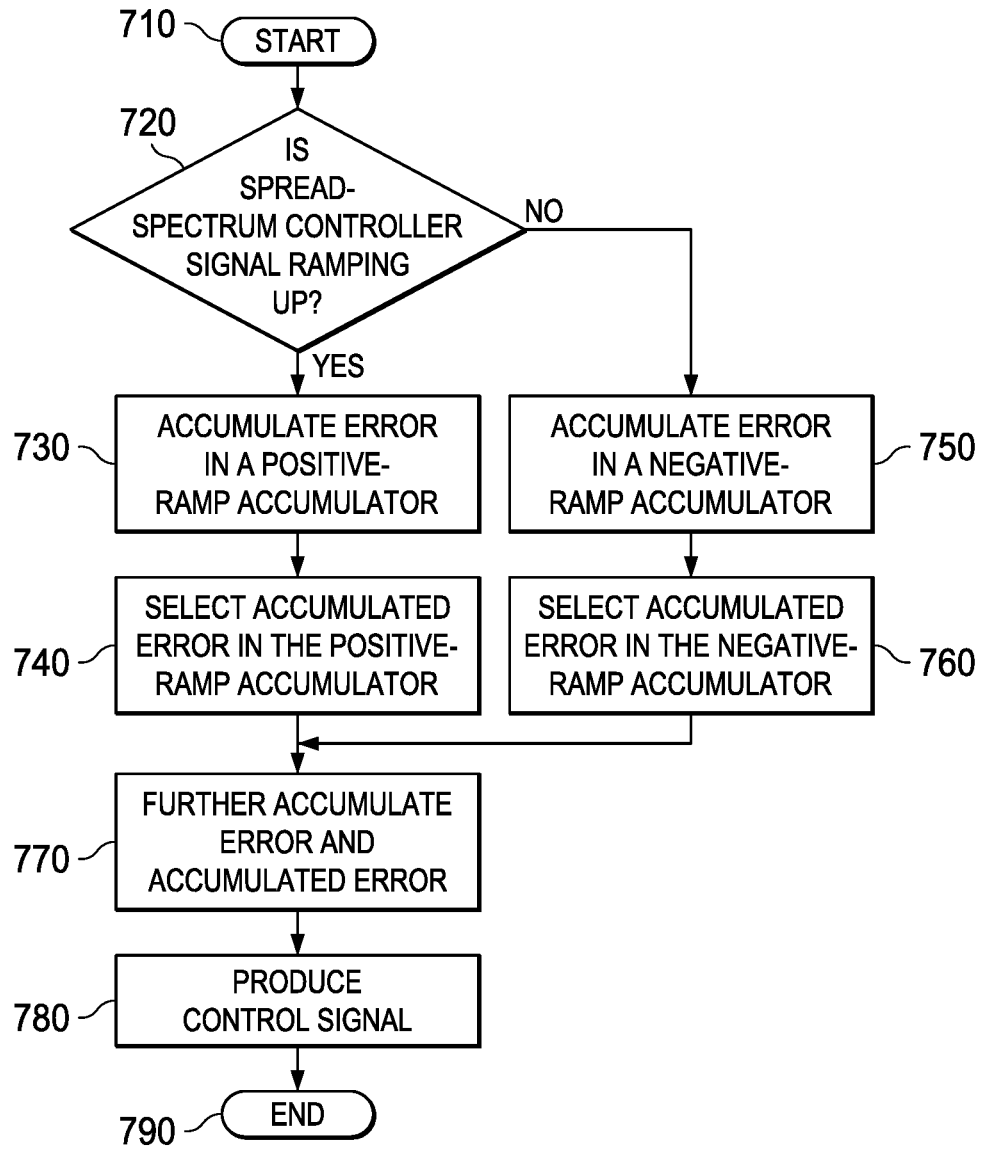
FIG. 7 is a flow diagram of one embodiment of a method of producing a digital control signal.

FIG. 7 is a flow diagram of one embodiment of a method of producing a digital control signal. In one embodiment, the method is carried out in a PFC in a BBDPLL and the control signal is the output of the PFC. The method begins in a start step 710. In a decisional step 720, a signal indicating the direction of the SSC ramp is detected. If the SSC is ramping up, the error is accumulated in a positive-ramp accumulator in a step 730, and the accumulated value in the positive-ramp accumulator is selected in a step 735. If the SSC is ramping down, the error is accumulated in a negative-ramp accumulator in a step 750, and the accumulated value in the negative-ramp accumulator is selected in a step 760. In a step 770, the error and the accumulated error selected above are further accumulated. In a step 780, a control signal is produced using the value obtained in the step 770. The method ends in an end step 790.

Those skilled in the art to which this application relates will appreciate that other and further additions, deletions, substitutions and modifications may be made to the described embodiments.

What is claimed is:

1. A digital phase-and-frequency controller, comprising:
a first segment accumulator operable to accumulate errors while an accumulation-selection signal has a first selection value;
a second segment accumulator operable to accumulate errors while said accumulation-selection signal has a second selection value; and
circuitry operable to produce a control signal using said errors accumulated in said first segment accumulator while a use-selection signal has a first value and said errors accumulated in said second segment accumulator while said use-selection signal has a second value,
wherein said accumulation-selection signal has said first selection value when a target frequency is ramping up and said second selection value when said target frequency is ramping down.

2. The digital phase-and-frequency controller as recited in claim 1 wherein said accumulation-selection and said use-selection signals are identical.

3. The digital phase-and-frequency controller as recited in claim 1 wherein said first and second accumulators are pre-programmed to initial values.

4. The digital phase-and-frequency controller as recited in claim 1 wherein said errors accumulated in said first segment accumulator and said errors accumulated in said second segment accumulator are nonlinear.

5. The digital phase-and-frequency controller as recited in claim 1 wherein said errors accumulated in said first segment accumulator and said errors accumulated in said second segment accumulator are bang-bang.

6. The digital phase-and-frequency controller as recited in claim 1 further comprising a frequency accumulator operable to multiply at least one of said errors accumulated in said first segment accumulator and said errors accumulated in said second segment accumulator by a gain.

7. A method of generating a digital control signal comprising:
accumulating errors in a first segment accumulator while an accumulation-selection signal has a first selection value;
accumulating errors in a second segment accumulator while said accumulation-selection signal has a second selection value; and
producing a control signal using said errors accumulated in said first segment accumulator while a use-selection signal has a first value and said errors accumulated in said second segment accumulator while said use-selection signal has a second value;
wherein said accumulation-selection signal has said first selection value when a target frequency is ramping up and said second selection value when said target frequency is ramping down.

8. The method as recited in claim 7 wherein said accumulation-selection and said use-selection signals are identical.

9. The method as recited in claim 7 further comprising pre-programming said first and second accumulators to initial values.

10. The method as recited in claim 7 wherein said errors accumulated in said first segment accumulator and said errors accumulated in said second segment accumulator are nonlinear.

11. The method as recited in claim 7 wherein said errors accumulated in said first segment accumulator and said errors accumulated in said second segment accumulator are bang-bang.

12. The method as recited in claim 7 further comprising multiplying at least one of said errors accumulated in said first segment accumulator and said errors accumulated in said second segment accumulator by a gain.

13. A digital spread-spectrum clock generator, comprising:
an oscillator;
a feedback loop; and
a phase-and-frequency controller including:
a first segment accumulator operable to accumulate errors while an accumulation-selection signal has a first selection value,
a second segment accumulator operable to accumulate errors while said accumulation-selection signal has a second selection value, and
circuitry operable to produce a control signal using said errors accumulated in said first segment accumulator while a use-selection signal has a first value and said errors accumulated in said second segment accumulator while said use-selection signal has a second value;
wherein said accumulation-selection signal has said first selection value when a target frequency is ramping up and said second selection value when said target frequency is ramping down.

14. The digital spread-spectrum clock generator as recited in claim 13 wherein said accumulation-selection and said use-selection signals are identical.

15. The digital spread-spectrum clock generator as recited in claim 13 wherein said first and second accumulators are pre-programmed to initial values.

16. The digital spread-spectrum clock generator as recited in claim 13 wherein said errors accumulated in said first segment accumulator and said errors accumulated in said second segment accumulator are nonlinear.

17. The digital spread-spectrum clock generator as recited in claim 13 wherein said errors accumulated in said first segment accumulator and said errors accumulated in said second segment accumulator are bang-bang.

18. The digital spread-spectrum clock generator as recited in claim 13 further comprising a frequency accumulator operable to multiply at least one of said errors accumulated in said first segment accumulator and said errors accumulated in said second segment accumulator by a gain.

19. The digital spread-spectrum clock generator as recited in claim 13 wherein said clock generator employs a phase interpolator.

20. The digital spread-spectrum clock generator as recited in claim 13 wherein said clock generator employs a multi-phase divider.

* * * * *